United States Patent
Hsu et al.

(10) Patent No.: US 6,616,510 B2
(45) Date of Patent: Sep. 9, 2003

(54) CHEMICAL MECHANICAL POLISHING METHOD FOR COPPER

(75) Inventors: Chia-Lin Hsu, Taipei (TW); Teng-Chun Tsai, Hsinchu (TW); Yung-Tsung Wei, Tainan Hsien (TW); Ming-Sheng Yang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/735,323

(22) Filed: Dec. 12, 2000

(65) Prior Publication Data

US 2002/0065025 A1 May 30, 2002

(30) Foreign Application Priority Data

Nov. 28, 2000 (TW) .............................. 89125183 A

(51) Int. Cl.⁷ .......................... H01L 21/465; B24B 7/20
(52) U.S. Cl. .................. 451/41; 438/692; 438/693; 451/37
(58) Field of Search ............................ 451/28, 36, 37, 451/41, 57, 60, 65; 438/690–693

(56) References Cited

U.S. PATENT DOCUMENTS

| 5,225,034 | A | * | 7/1993 | Yu et al. ................ 216/89 |
| 5,354,490 | A | * | 10/1994 | Yu et al. ................ 252/79.1 |
| 5,840,629 | A | * | 11/1998 | Carpio ................... 216/105 |
| 6,083,840 | A | * | 7/2000 | Mravic et al. ............ 438/693 |
| 6,242,351 | B1 | * | 6/2001 | Li et al. ................ 216/89 |
| 6,355,075 | B1 | * | 3/2002 | Ina et al. ................ 106/3 |
| 6,375,693 | B1 | * | 4/2002 | Cote et al. .............. 106/3 |

* cited by examiner

Primary Examiner—Joseph J. Hail, III
Assistant Examiner—David B. Thomas
(74) Attorney, Agent, or Firm—J. C. Patents

(57) ABSTRACT

A chemical-mechanical polishing method for polishing a copper oxide layer and a copper layer. The copper oxide layer above the copper layer is first polished using an aqueous solution having a high concentration of polishing particles/chelating agent. The copper layer is then polished using a polishing slurry having a low concentration of polishing particles/chelating agent or the polishing slurry free of polishing particles/chelating agent. Alternatively, the copper oxide layer is polished using a mixture of the aqueous solution and the polishing slurry. After the copper oxide layer is removed, the copper layer is polished using the polishing slurry alone.

38 Claims, 3 Drawing Sheets

CHEMICAL MECHANICAL POLISHING METHOD FOR COPPER

CROSS-REFERENCE TO RELATED APPLICATION

This application claims the priority benefit of Taiwan application Ser. No. 89125183, filed Nov. 28, 2000.

BACKGROUND OF THE INVENTION

1. Field of Invention

The present invention relates to a chemical-mechanical polishing method. More particularly, the present invention relates to a chemical-mechanical polishing method for polishing a copper layer.

2. Description of Related Art

Chemical mechanical polishing is one of the global planarization methods known and adopted in an ultra-large scale integration (ULSI) integrated circuit fabrication. The method is a planarization technique based on a mechanical polishing theory using an abrasive means. The abrasive means is then supplied with an appropriate reagent to planarize by polishing a non-planar surface profile of the wafer.

In chemical-mechanical polishing, the reagent usually refers to a slurry, which is mainly a colloidal solution of silica or dispersed alumina solution. The hard silica or alumina particles inside the slurry provide the necessary abrasion for polishing a silicon chip.

FIGS. 1A and 1B are schematic cross-sectional views showing the method of planarizing a copper layer by conventional chemical-mechanical polishing. As shown in FIG. 1A, a substrate 100 having a wide opening 102*a* and several densely distributed narrow openings 102*b* is provided. A copper layer 104 is formed to completely cover the substrate 100 and fill the wide opening 102*a* and the narrow openings 102*b*. Since the upper surface of the copper layer 104 is exposed to air, a copper oxide layer 106 is formed over the copper layer 104.

During the method of forming a damascene structure, the copper oxide layer 106 as well as any excess portion of the copper layer 104 above the substrate 100 must be removed. However, as the copper oxide 106 has an unusual hardness, it would require a long polishing time to remove the copper oxide layer 106 if conventional slurry were used in the polishing method. This leads to a drop in productivity. To speed up the polishing rate, slurry 108 having a high concentration of suspended particles has been conventionally used to polish the copper oxide layer 106 and the copper layer 104. The suspended particles made up about 5% concentration of the slurry 108.

Since the copper oxide layer 106 and an excess portion of the copper layer 104 are simultaneously removed using the slurry 108 highly concentrated with the suspended particles, the wide opening 102*a* forms a dish surface as shown in FIG. 1B. Such dishing problem also occurs in the narrow opening 102*b*. In addition, erosion of the dielectric layer in the substrate 100 occurs in a region densely distributed with narrow openings 102*b*, leading to other problems.

SUMMARY OF THE INVENTION

Accordingly, the present invention provides a chemical-mechanical polishing method for copper to prevent dishing problem due to the use of an aqueous solution containing a high concentration of polishing particles, while an erosion of a substrate in a densely distributed copper wire region is avoided.

To achieve these and other advantages and in accordance with the purpose of the invention, as embodied and broadly described herein, the invention provides a chemical-mechanical polishing method for copper. First, an aqueous solution having a high concentration of polishing particles/chelating agent is used to polish away a copper oxide layer naturally formed at the upper surface of a copper layer. A polishing slurry having either a low concentration of polishing particles/chelating agent or free of polishing-particle/chelating agent is then used to continue the polishing of the copper layer.

This invention also provides an alternative chemical-mechanical polishing method for copper. First, the polishing slurry and the aqueous solution having a high concentration of polishing particles/chelating agent are mixed in situ to remove the copper oxide layer at the top surface of the copper layer. After the copper oxide is removed, the polishing slurry having a low concentration of the polishing particles/chelating agent or free of the polishing-particles/chelating agent is used in the polishing step to polish the copper layer.

One major aspect of this invention is an initial increase in the polishing rate of the copper oxide layer, while the dishing of the copper layer and the erosion of the substrate surface that occurred are minimized.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
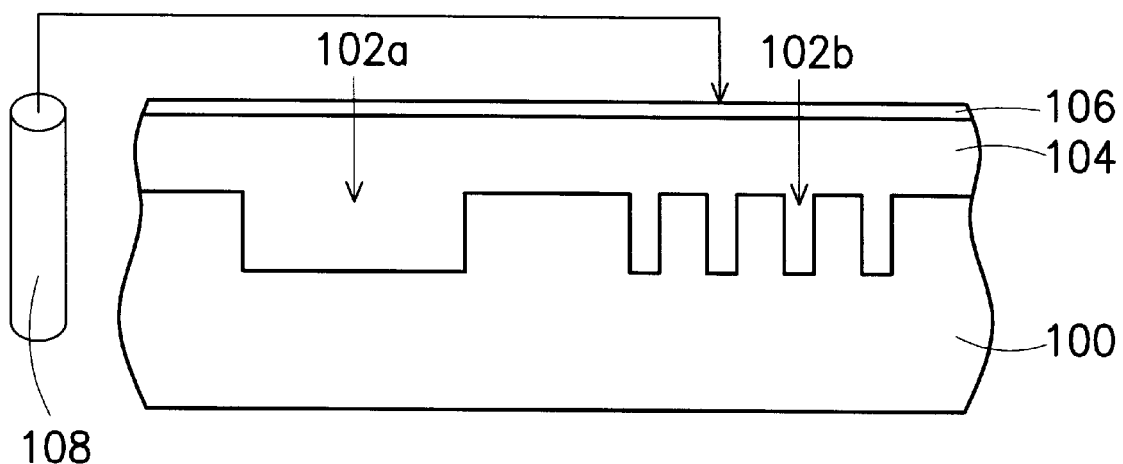
FIGS. 1A and 1B are schematic cross-sectional views showing planarizing of a copper layer by a conventional chemical-mechanical polishing method.
Figure 1B:
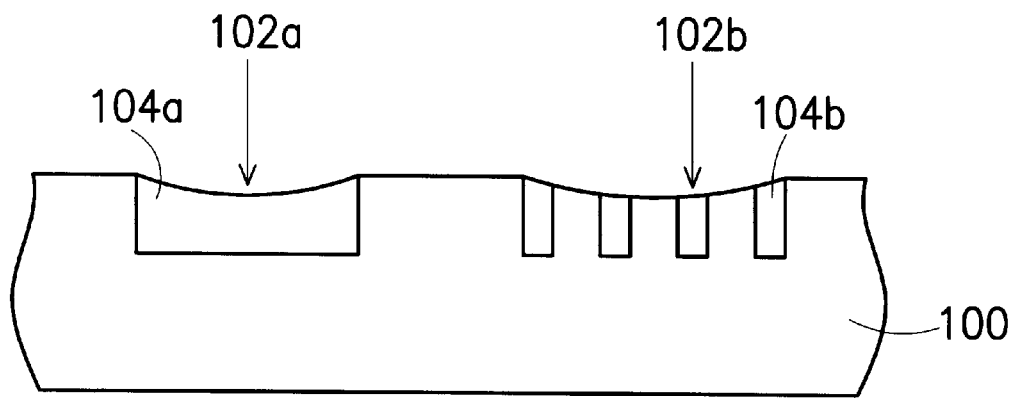

Reference will now be made in detail to the present preferred embodiments of the invention, examples of which are illustrated in the accompanying drawings. Wherever possible, the same reference numbers are used in the drawings and the description to refer to the same or like parts.

Figure 2A:
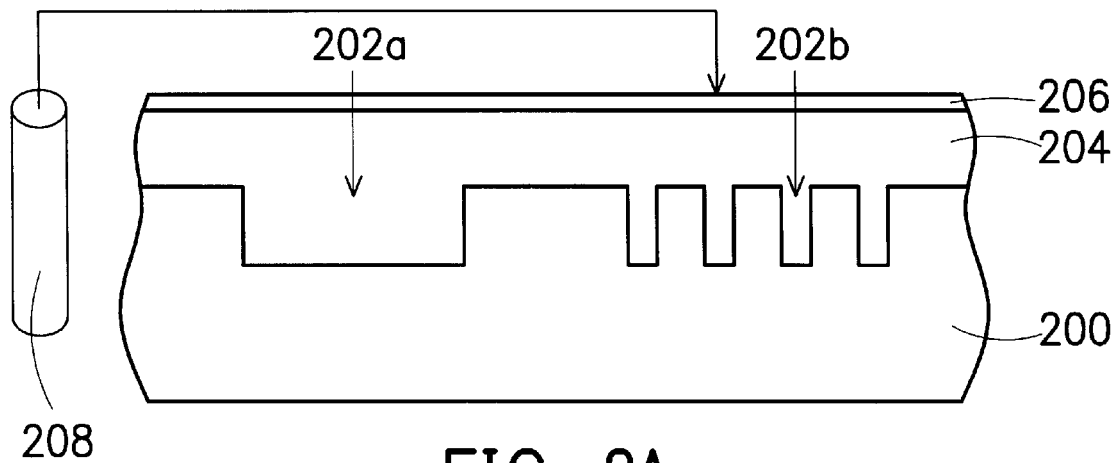
FIGS. 2A to 2C are schematic cross-sectional views showing planarizing of a copper layer by a chemical-mechanical polishing method according to the first preferred embodiment of this invention.
Figure 2B:
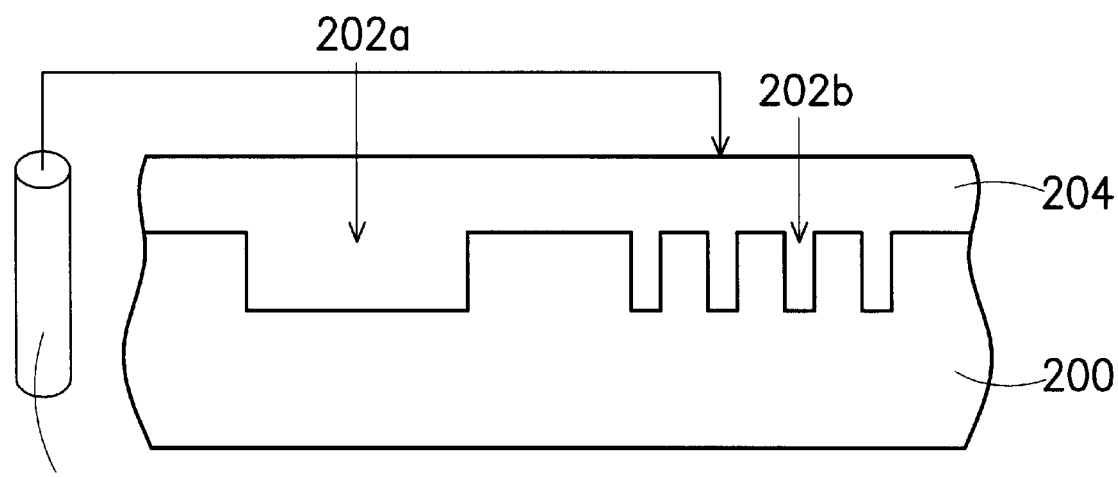
Figure 2C:
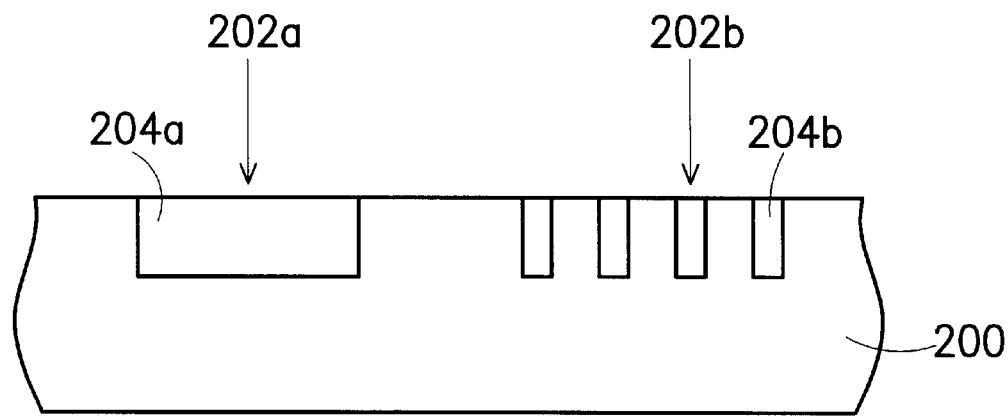

FIGS. 2A to 2C are schematic cross-sectional views showing planarizing of a copper layer by a chemical-mechanical polishing method according to the first preferred embodiment of this invention.

As shown in FIG. 2A, a substrate 200 is provided. The substrate 200 has a wide opening 202*a* and several narrow openings 202b formed close to each other. A copper layer 204 is formed over the substrate 200. The copper layer 204 fills the wide opening 202a and the narrow openings 202b. The openings 202a and 202b can be dual damascene openings for forming a copper dual damascene structure, trenches for forming copper conductive wires, via openings or contact openings for forming copper plugs or any openings for forming a damascene structure, for example. Since the copper layer 204 is most probably exposed to air, a copper oxide layer 206 is generally formed over the copper layer 204.

In the method of forming a damascene structure, the copper oxide layer 206 and a portion of the copper layer 204 above the substrate 200 surface must be removed. In this invention, a chemical-mechanical polishing method using an aqueous solution 208 having a high concentration of polishing particles/chelating agent is first conducted to polish the copper oxide layer 206 until the copper oxide layer 206 is completely removed. The aqueous solution 208 preferably has a concentration of the polishing particles/chelating agent of no less than 5%, that is the concentration of the polishing particles/chelating agent in the aqueous solution 208 is greater or equal to 5%. The chelating agent can chelate with the copper oxide layer 206 on the copper layer 204 to form a soluble complex that is removed. The chelating agent may be chemical that reacts with copper ions to form a soluble compound. Preferably, the chelating agent includes a citric acid and an oxalic acid. The aqueous solution further comprises of water, a surfactant, a buffer solution, an oxidizing agent, and so on. The surfactant serves to disperse the polishing particles and prevent conglomeration and congealing of polishing particles into lumps, while the buffer solution serves to control a pH value of the slurry.

As shown in FIG. 2B, a polishing slurry 210 having a low concentration of the polishing particles or free of the polishing particles is used to polish the copper layer 204 after the copper oxide layer 206 is completely removed. Alternatively, the polishing is performed using a polishing slurry 210 having a low concentration of the chelating agent or free of the chelating agent. The method continues until the portion of the copper layer 204 above the substrate 200 is completely removed. The polishing particles/chelating agent have a concentration of about 0.01~2% in the polishing slurry 210 having the low concentration of the polishing particles/chelating agent. Other ingredients of the polishing slurry 210 include water, an oxidizing agent, a surfactant and a buffer solution. The surfactant serves to disperse the polishing particles so that conglomeration of the polishing particles into lumps is prevented. The buffer solution serves to control the pH value of the polishing slurry. In the method of polishing the copper layer 204, a portion of the copper layer being removed may oxidize into copper oxide particles. These copper oxide particles can serve as additional polishing particles in the slurry. Therefore, the copper layer 204 may be polished using the polishing slurry free of the polishing particles.

As shown in FIG. 2C, a planar copper layer 204a is formed inside the wide opening 202a. Similarly, the planar copper layer 204b is formed inside the narrow openings 202b. Moreover, the erosion of substrate 200 in the dense copper line region is greatly reduced.

Figure 3A:
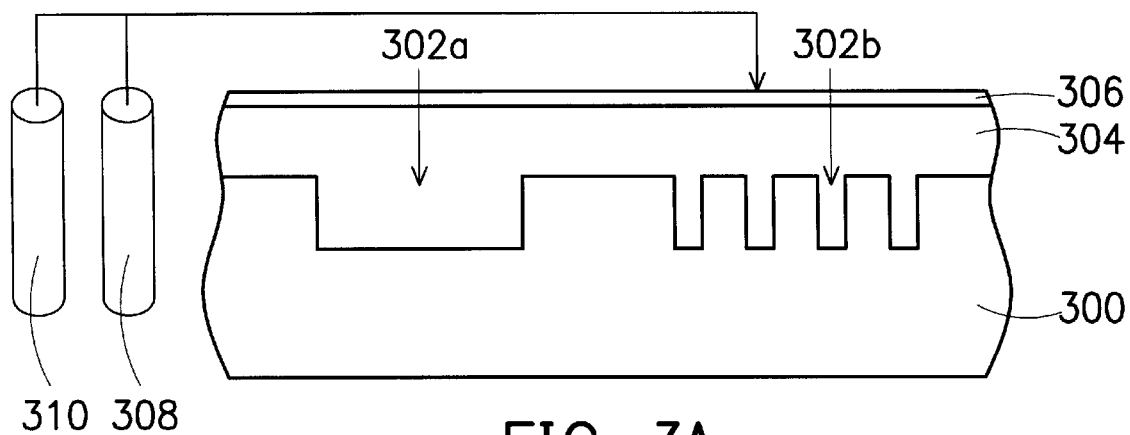
FIGS. 3A to 3C are schematic cross-sectional views showing planarizing of a copper layer by a chemical-mechanical polishing method according to the second preferred embodiment of this invention.
Figure 3B:
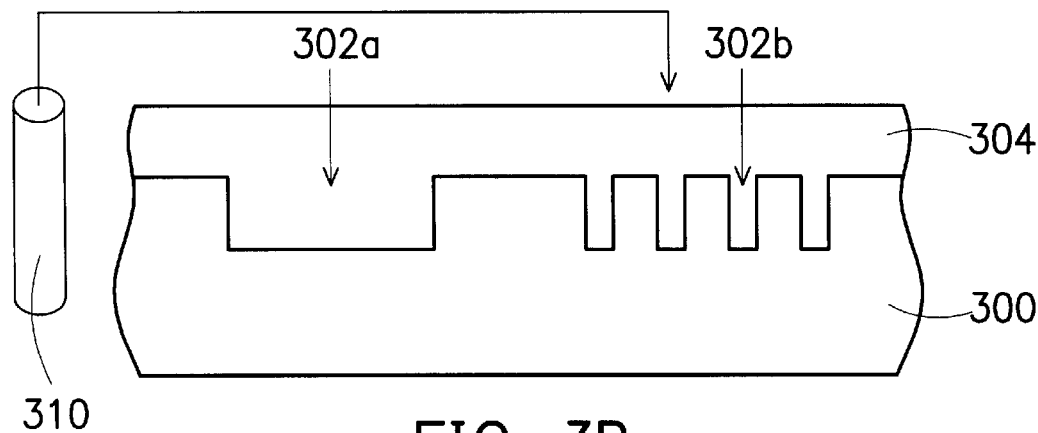
Figure 3C:
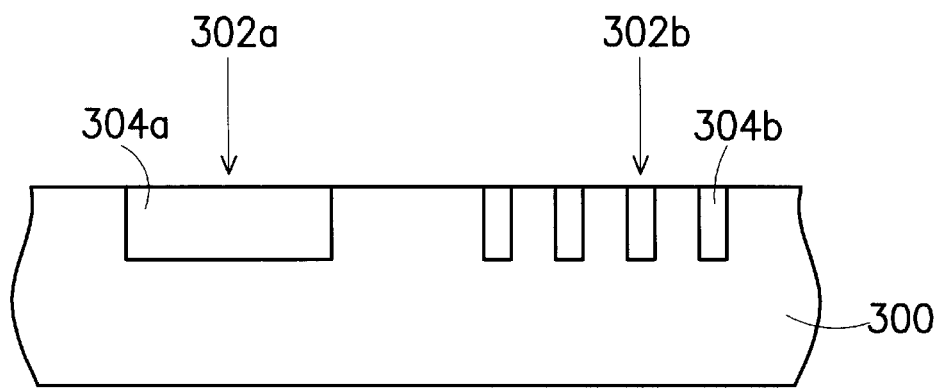

FIGS. 3A to 3C are schematic cross-sectional views showing planarizing of a copper layer by a chemical-mechanical polishing method according to the second preferred embodiment of this invention.

As shown in FIG. 3A, a substrate 300 is provided. The substrate 300 has a wide opening 302a and several narrow openings 302b formed close to each other. A copper layer 304 is formed over the substrate 300. The copper layer 304 fills the wide opening 302a and the narrow openings 302b. The openings 302a and 302b can be dual damascene openings for forming a copper dual damascene structure, trenches for forming copper conductive wires, via openings or contact openings for forming copper plugs or any openings for forming a damascene structure, for example. Since the copper layer 304 is most probably exposed to air, a copper oxide layer 306 is generally formed over the copper layer 304.

In the method of forming a damascene structure, the copper oxide layer 306 and a portion of the copper layer 302 above the substrate 300 must be removed. In this invention, an aqueous solution 308 with a high concentration of the polishing particles/chelating agent is mixed in-situ with a polishing slurry having a low concentration of the polishing particles/chelating agent or free of the polishing particles/chelating agent. A chemical-mechanical polishing method is then performed using the mixture described above to polish the copper oxide layer 306 until the copper oxide layer 306 is completely removed. The aqueous solution 308 preferably has a concentration of the polishing particles/chelating agent of no less than 5%, that is, the concentration of the polishing particles/chelating agent in the aqueous solution 308 is greater or equal to 5%. The chelating agent can chelate with the copper oxide layer 306 on the copper layer 304 to form a soluble complex that is removed. The chelating agent includes a citric acid and an oxalic acid. The aqueous solution 308 further comprises of water, a surfactant, a buffer solution, an oxidizing agent, and so on. The surfactant serves to disperse the polishing particles and prevents conglomeration and congealing of polishing particles into lumps. The buffer solution serves to control the pH value of the polishing slurry. Ingredients of the copper slurry 310 further include water, an oxidizing agent, a surfactant and a buffer solution. The surfactant serves to disperse the polishing particles so that conglomeration of the polishing particles into lumps is prevented. The buffer solution serves to control the pH value of the polishing slurry.

As shown in FIG. 3B, supply of the aqueous solution 308 having a high concentration of the polishing particles/chelating agent is stopped after the copper oxide layer 306 is completely removed. The chemical-mechanical polishing method continues until the portion of the copper layer 302 above the substrate 300 is completely removed. The polishing method is performed using the polishing slurry 310 having a low concentration of the polishing particles/chelating agent or the polishing slurry free of the polishing particles/chelating agent. During the step of removing the copper layer 304, a portion of the copper layers being removed may oxidize into copper oxide particles. These copper oxide particles can serve as additional polishing particles in the polishing slurry. Therefore, the copper layer 304 may be polished using the polishing slurry free of the polishing particles.

As shown in FIG. 3C, a highly planar copper layer 304a is formed inside the wide opening 302a. Similarly, the highly planar copper layer 304b is formed inside the narrow openings 302b. Moreover, the erosion of substrate 300 in the dense copper line region is greatly reduced.

Summarized from the above, the polishing rate of copper oxide layer is increased while dishing of the copper layer and erosion of substrate are prevented in the chemical mechanical polishing method of the present invention aqueousmethod It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chemical-mechanical polishing method for removing a copper oxide layer and a copper layer above a substrate using a slurry, the slurry comprising of:
   an aqueous solution having polishing particles at a first concentration; and
   a polishing slurry having the polishing particles at a second concentration, wherein
      the first concentration is higher than the second concentration, and the aqueous solution is used prior to the polishing slurry.

2. The polishing method of claim 1, wherein steps of removing the copper oxide layer and the copper layer above the substrate using the slurry include:
   polishing the copper oxide layer using a supply of the aqueous solution until the copper oxide layer is completely removed;
   terminating the supply of the aqueous solution; and
   polishing the copper layer with a supply of the polishing slurry.

3. The polishing method of claim 1, wherein steps of removing the copper oxide layer and the copper layer above the substrate include:
   mixing a supply of the aqueous solution and a supply of the polishing slurry, so that the copper oxide layer is polished until the copper oxide layer is completely removed; and
   terminating the supply of the aqueous solution and maintaining the polishing slurry for polishing the copper layer.

4. The polishing method of claim 1, wherein the polishing particles in the aqueous solution have a concentration of not less than about 5%.

5. The polishing method of claim 1, wherein the polishing particles in the polishing slurry have a concentration of about 0.01~2%.

6. The polishing method of claim 1, wherein the aqueous solution further includes water, a surfactant, and a buffer solution.

7. The polishing method of claim 6, wherein the surfactant serves to disperse the polishing particles.

8. The polishing method of claim 6, wherein the buffer solution serves to control a pH value of the aqueous solution.

9. The polishing method of claim 1, wherein the polishing slurry further includes water, a surfactant, a buffer solution, and an oxidizing agent.

10. The polishing method of claim 9, wherein the surfactant serves to disperse the polishing particles.

11. The polishing method of claim 9, wherein the buffer solution serves to control a pH value of the polishing slurry.

12. A chemical-mechanical polishing method for removing a copper oxide layer and a copper layer above a substrate using slurry, the slurry comprising of:
   an aqueous solution having polishing particles at a first concentration; and
   a polishing slurry free of the polishing particles, wherein the aqueous solution is used prior to the polishing slurry.

13. The polishing method of claim 12, wherein steps of removing the copper oxide layer and the copper layer above the substrate using the slurry include:
   polishing the copper oxide layer with a supply of the aqueous solution until the copper oxide layer is completely removed; and
   terminating the supply of the aqueous solution and polishing the copper layer with a supply of the polishing slurry.

14. The polishing method of claim 12, wherein steps of removing the copper oxide layer and the copper layer above the substrate include:
   mixing a supply of the the aqueous solution and a supply of the polishing slurry until the copper oxide layer is completely removed; and
   terminating the supply of the aqueous solution and maintaining the supply of the polishing slurry for polishing the copper layer.

15. The polishing method of claim 12, wherein the first concentration is not less than about 5%.

16. The polishing method of claim 12, wherein the aqueous solution further includes water, a surfactant, and a buffer solution.

17. The polishing method of claim 16, wherein the polishing slurry further includes water, a surfactant, a buffer solution and an oxidizing agent.

18. The polishing method of claim 17, wherein the buffer solution serves to control the pH value of the polishing slurry.

19. A chemical-mechanical polishing method for removing a copper oxide layer and a copper layer above a substrate using a slurry, the slurry comprising of:
   an aqueous solution having a chelating agent at a first concentration; and
   a polishing slurry having the chelating agent at a second concentration, wherein
      the first concentration is higher than the second concentration.

20. The polishing method of claim 19, steps of removing the copper oxide layer and the copper layer above the substrate using the slurry include:
   polishing the copper oxide layer using a supply of the aqueous solution until the copper oxide layer is completely removed;
   terminating the supply of the aqueous solution; and
   polishing the copper layer with a supply of the polishing slurry.

21. The polishing method of claim 19, wherein steps of removing the copper oxide layer and the copper layer above the substrate include:
   mixing a supply of the aqueous solution and a supply of the polishing slurry, so that the copper oxide layer is polished until the copper oxide layer is completely removed; and
   terminating the supply of the aqueous solution and maintaining the polishing slurry for polishing the copper layer.

22. The polishing method of claim 19, wherein the chelating agent in the aqueous solution have a concentration of not less than about 5%.

23. The polishing method of claim 19, wherein the chelating agent in the polishing shiny have a concentration of about 0.01~2%.

24. The polishing method of claim 19, wherein the chelating agent includes citric acid.

25. The polishing method of claim 19, wherein the chelating agent includes oxalic acid.

26. The polishing method of claim 19, wherein the aqueous solution further includes water, a surfactant, and a buffer solution.

27. The polishing method of claim 26, wherein the buffer solution serves to control a pH value of the aqueous solution.

28. The polishing method of claim 19, wherein the polishing slurry further includes water, a surfactant, a buffer solution, and an oxidizing agent.

29. The polishing method of claim 28, wherein the buffer solution serves to control a pH value of the polishing slurry.

30. A chemical-mechanical polishing method for removing a copper oxide layer and a copper layer above a substrate using slurry, the slurry comprising of:

an aqueous solution having a chelating agent at a first concentration; and a polishing slurry free of the chelating agent.

31. The polishing method of claim 30, wherein steps of removing the copper oxide layer and the copper layer above the substrate using the slurry include:

polishing the copper oxide layer with a supply of the aqueous solution until the copper oxide layer is completely removed; and terminating the supply of the aqueous solution and polishing the copper layer with a supply of the polishing slurry.

32. The polishing method of claim 30, wherein steps of removing the copper oxide layer and the copper layer above the substrate include:

mixing a supply of the aqueous solution and a supply of the polishing slurry until the copper oxide layer is completely removed; and terminating the supply of the aqueous solution and maintaining the supply of the polishing slurry for polishing the copper layer.

33. The polishing method of claim wherein the first concentration is not less than about 5%.

34. The polishing method of claim 30, wherein the chelating agent includes citric acid.

35. The polishing method of claim 30, wherein the chelating agent includes oxalic acid.

36. The polishing method of claim 30, wherein the aqueous solution further includes water, a surfactant, and a buffer solution.

37. The polishing method of claim 36, wherein the polishing slurry further includes water, a surfactant, a buffer solution and an oxidizing agent.

38. The polishing method of claim 37, wherein the buffer solution serves to control the pH value of the polishing slurry.

* * * * *